United States Patent
McLellan et al.

(10) Patent No.: US 7,358,119 B2
(45) Date of Patent: Apr. 15, 2008

(54) THIN ARRAY PLASTIC PACKAGE WITHOUT DIE ATTACH PAD AND PROCESS FOR FABRICATING THE SAME

(75) Inventors: Neil McLellan, Danville, CA (US); Serafin Pedron, Manteca, CA (US); Leo M. Higgins, III, Austin, TX (US); Kwok Cheung Tsang, Fauling (HK); Kin Pui Kwan, Kowloon (HK)

(73) Assignee: Asat Ltd., Tsuen Wan, New Territories (HK)

( * ) Notice: Subject to any disclaimer, the term of this patent is extended or adjusted under 35 U.S.C. 154(b) by 360 days.

(21) Appl. No.: 11/033,928

(22) Filed: Jan. 12, 2005

(65) Prior Publication Data

US 2006/0154403 A1 Jul. 13, 2006

(51) Int. Cl.
*H01L 21/00* (2006.01)

(52) U.S. Cl. .............. 438/127; 257/E21.503; 438/116

(58) Field of Classification Search .......... 438/674, 438/116, 127, 673; 257/E21.502, E21.503, 257/E21.506
See application file for complete search history.

(56) References Cited

U.S. PATENT DOCUMENTS

| | | |
|---|---|---|
| 4,530,152 A | 7/1985 | Roche et al. |
| 4,685,998 A | 8/1987 | Quinn et al. |
| 4,812,896 A | 3/1989 | Rothgery et al. |
| 5,066,831 A | 11/1991 | Spielberger et al. |
| 5,157,480 A | 10/1992 | McShane et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,221,642 A | 6/1993 | Burns |
| 5,273,938 A | 12/1993 | Lin et al. |
| 5,277,972 A | 1/1994 | Sakumoto et al. |
| 5,279,029 A | 1/1994 | Burns |
| 5,293,072 A | 3/1994 | Tsuji et al. |
| 5,332,864 A | 7/1994 | Liang et al. |
| 5,343,076 A | 8/1994 | Katayama et al. |
| 5,406,124 A | 4/1995 | Morita et al. |
| 5,424,576 A | 6/1995 | Djennas et al. |
| 5,444,301 A | 8/1995 | Song et al. |
| 5,457,340 A | 10/1995 | Templeton, Jr. et al. |
| 5,474,958 A | 12/1995 | Djennas et al. |

(Continued)

FOREIGN PATENT DOCUMENTS

JP 59-208756 11/1984

*Primary Examiner*—Caridad Everhart
(74) *Attorney, Agent, or Firm*—Morrison & Foerster LLP

(57) ABSTRACT

A process for fabricating an integrated circuit package. Metal is plated up on a substrate to provide a plurality of contact pads and a plurality of fiducial markings on a periphery of the contacts. A transparent mask is selectively deposited on the substrate, over the fiducial markings. A semiconductor die is mounted on the substrate such that the contact pads circumscribe the semiconductor die and the semiconductor die is wire bonded to ones of the contact pads. The wire bonds are encapsulated and the semiconductor die and contact pads are covered in a molding material. The substrate is selectively etched to thereby etch away the substrate underneath the contact pads and the semiconductor die. The integrated circuit package is singulated from other integrated circuit packages by sawing using the fiducial markings.

24 Claims, 14 Drawing Sheets

Electroplate / Metallization Build up

U.S. PATENT DOCUMENTS

| | | |
|---|---|---|
| 5,483,099 A | 1/1996 | Natarajan et al. |
| 5,604,376 A | 2/1997 | Hamburgen et al. |
| 5,608,267 A | 3/1997 | Mahulikar et al. |
| 5,639,990 A | 6/1997 | Nishihara et al. |
| 5,640,047 A | 6/1997 | Nakashima |
| 5,641,997 A | 6/1997 | Ohta et al. |
| 5,646,831 A | 7/1997 | Manteghi |
| 5,650,663 A | 7/1997 | Parthasarathi |
| 5,683,806 A | 11/1997 | Sakumoto et al. |
| 5,696,666 A | 12/1997 | Miles et al. |
| 5,701,034 A | 12/1997 | Marrs |
| 5,710,064 A | 1/1998 | Song et al. |
| 5,710,695 A | 1/1998 | Manteghi |
| 5,777,382 A | 7/1998 | Abbott et al. |
| 5,894,108 A | 4/1999 | Mostafazadeh et al. |
| 5,976,912 A | 11/1999 | Fukutomi et al. |
| 6,001,671 A | 12/1999 | Fjelstad |
| 6,057,601 A | 5/2000 | Lau et al. |
| 6,124,637 A | 9/2000 | Freyman et al. |
| 6,194,786 B1 | 2/2001 | Orcutt |
| 6,229,200 B1 | 5/2001 | Mclellan et al. |
| 6,294,830 B1 | 9/2001 | Fjelstad |
| 6,306,685 B1 | 10/2001 | Liu et al. |
| 6,459,163 B1 | 10/2002 | Bai |
| 6,489,557 B2 | 12/2002 | Eskildsen et al. |
| 6,498,099 B1 | 12/2002 | McLellan et al. |
| 6,528,877 B2 | 3/2003 | Ernst et al. |
| 6,585,905 B1 | 7/2003 | Fan et al. |
| 6,635,957 B2 | 10/2003 | Kwan et al. |
| 6,762,118 B2 | 7/2004 | Liu et al. |
| 7,157,353 B2 * | 1/2007 | Farnworth et al. .......... 438/462 |
| 2003/0015780 A1 | 1/2003 | Kang et al. |
| 2004/0097086 A1* | 5/2004 | Igarashi et al. ............. 438/690 |

* cited by examiner

Develop

Electroplate / Metallization Build up

Strip

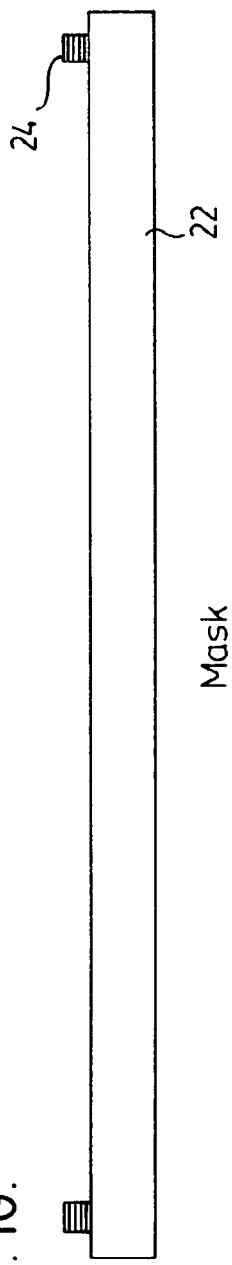
FIG. 1G. Mask
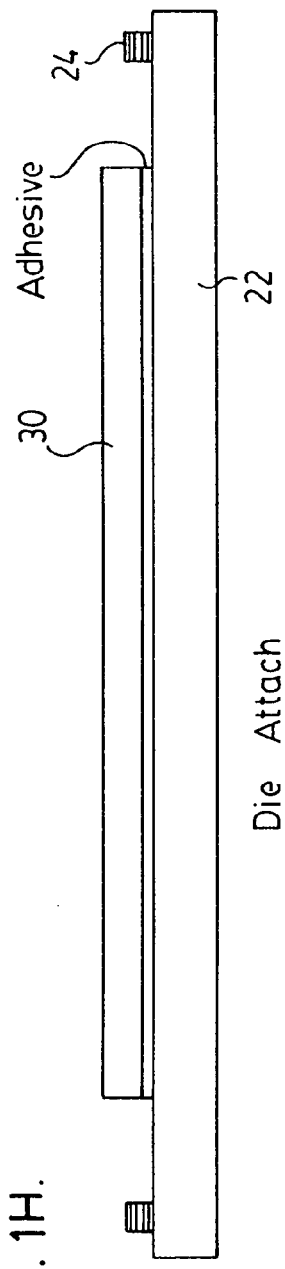
FIG. 1H. Die Attach
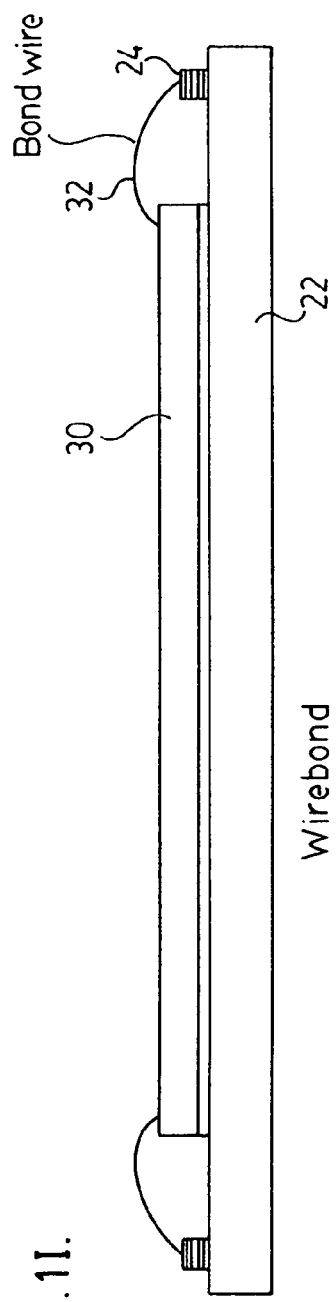
FIG. 1I. Wirebond

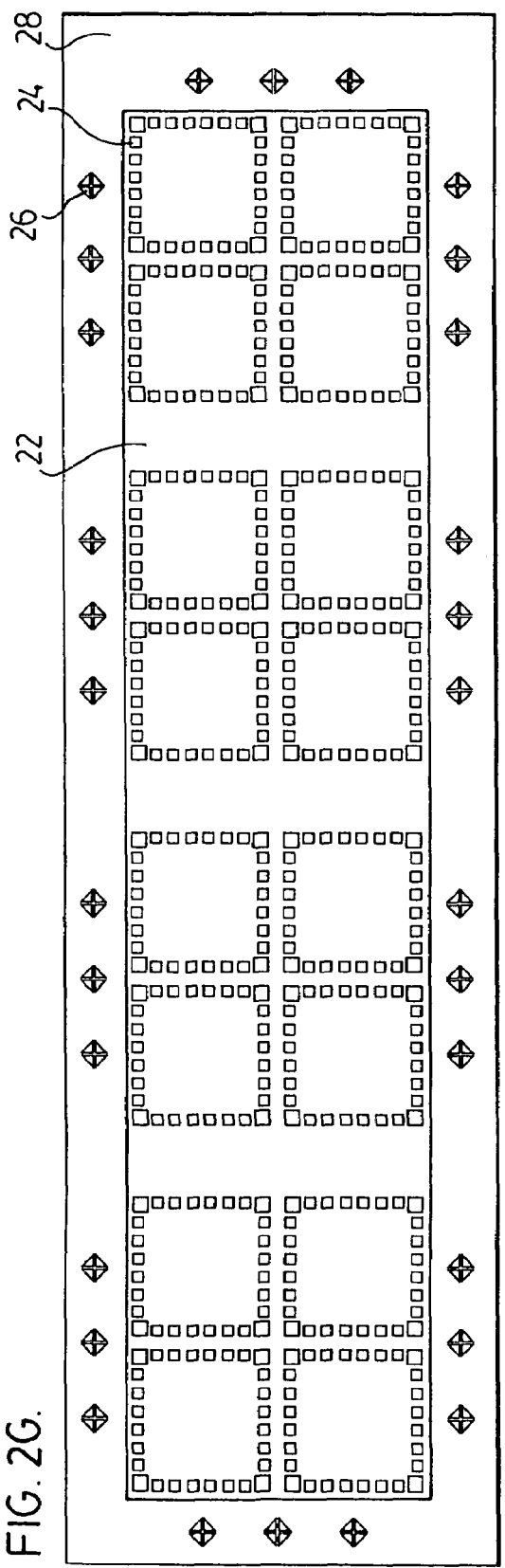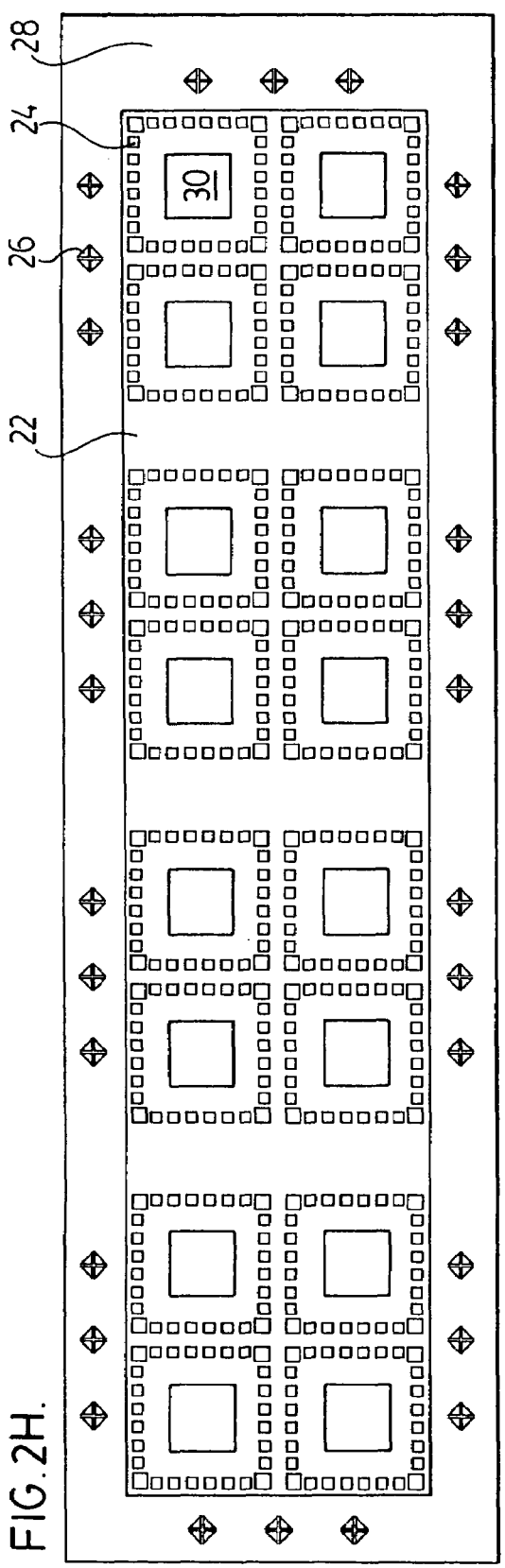

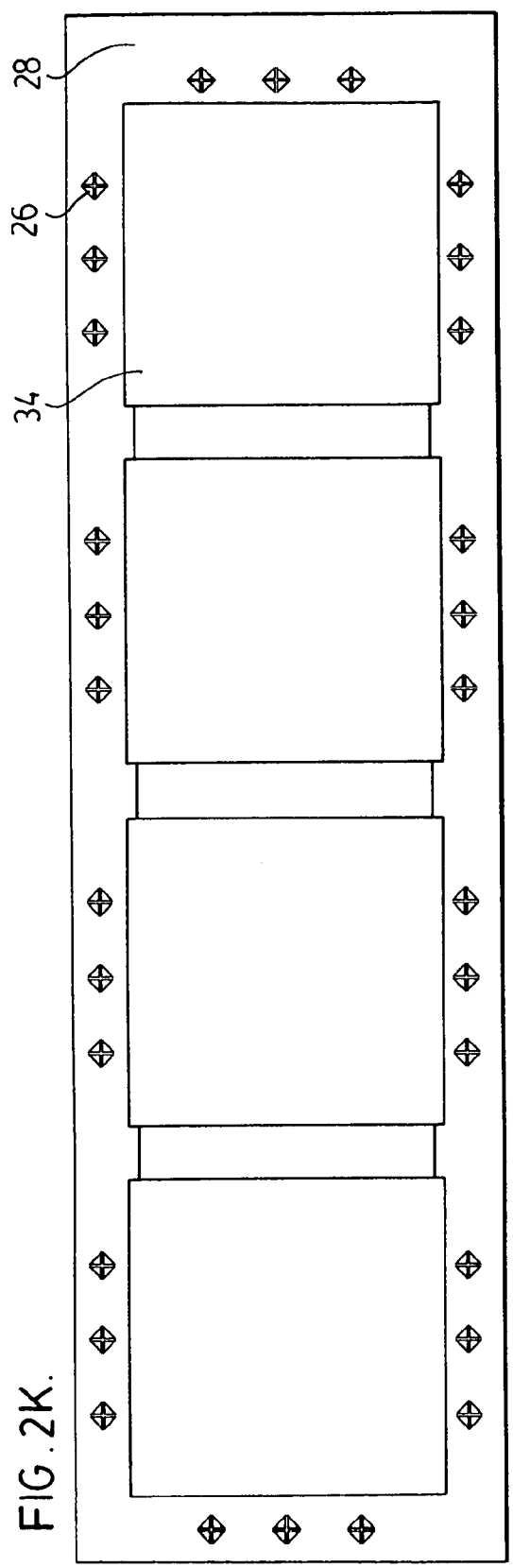
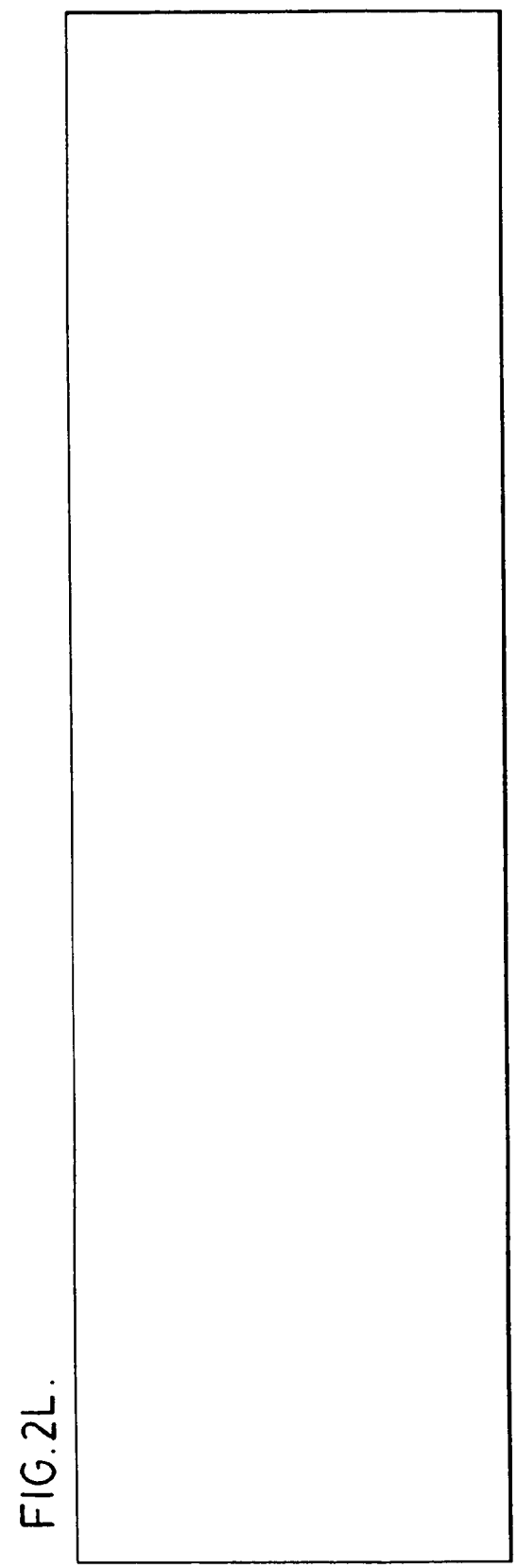
FIG. 2K.
FIG. 2L.

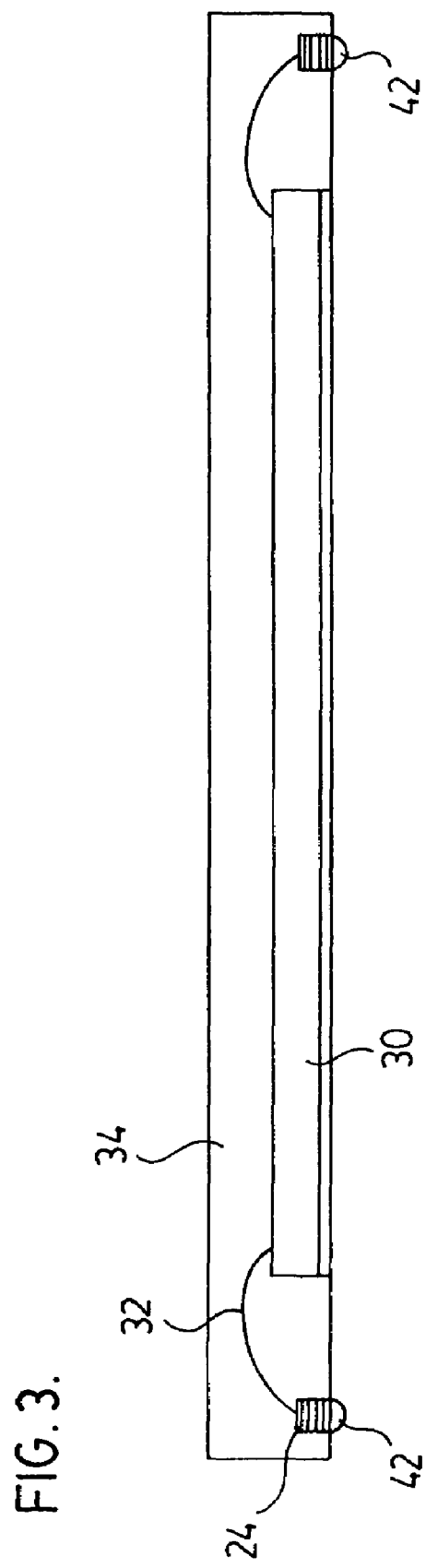

US 7,358,119 B2

THIN ARRAY PLASTIC PACKAGE WITHOUT DIE ATTACH PAD AND PROCESS FOR FABRICATING THE SAME

FIELD OF THE INVENTION

The present invention relates in general to integrated circuit packaging and more particularly to a leadless plastic chip carrier that does not have a die attach pad and that includes a post-mold etch step to etch away a copper carrier.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die attach pad (paddle) is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features of outer leads is eliminated and no outer leads are necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, issued May 8, 2001, the contents of which are incorporated herein by reference.

Applicant's LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern formed by fiducial marks on the bottom side of the leadframe strip. Also, special mold processing techniques are used to prevent the mold flow from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to Applicants' U.S. Pat. No. 6,294,100, the contents of which are incorporated herein by reference, a process for fabricating a leadless plastic chip carrier that does not include a die attach pad is provided. A leadframe strip including a number of contact pads, is attached to an adhesive strip. The semiconductor die is fixed to the adhesive strip and the semiconductor die is wire bonded to the contact pads. After encapsulation, the adhesive strip is removed and the leadless plastic chip carrier is singulated from the remainder of the strips. Such devices offer increased I/O density over traditional packages.

While these processes yield IC package designs with improved performance and increased I/O density, further IC package improvements are still desirable and are driven by industry demands for increased thermal and electrical performance and decreased size and cost of manufacture.

SUMMARY OF THE INVENTION

In one aspect of the present invention there is provided a process for fabricating an integrated circuit package. Metal is plated up on a substrate to provide a plurality of contact pads and a plurality of fiducial markings on a periphery of the contact pads. A transparent mask is selectively deposited on the substrate, over the fiducial markings. A semiconductor die is mounted on the substrate such that the contact pads circumscribe the semiconductor die and the semiconductor die is wire bonded to ones of the contact pads. The wire bonds are encapsulated and the semiconductor die and contact pads are covered in a molding material. The substrate is selectively etched to thereby etch away the substrate underneath the contact pads and the semiconductor die. The integrated circuit package is singulated from other integrated circuit packages by sawing using the fiducial markings.

In another aspect of the present invention, there is provided a process for fabricating a plurality of integrated circuit packages. Metal is selectively plated up on a substrate to provide a plurality of sets of contacts pads. A plurality of semiconductor dice are mounted on the substrate, each one of the semiconductor dice being circumscribed by a respective one of the sets of contact pads. The semiconductor dice are wire bonded to contact pads of respective ones of the sets of contact pads. The wire bonds are encapsulated and the semiconductor dice and sets of contact pads are covered in a molding material. The substrate is selectively etched to thereby etch away the substrate underneath the contact pads and the semiconductor dice. The substrate is mounted to a tape in a void in a carrier frame. The integrated circuit packages are singulated by sawing through the molding material and the substrate without sawing entirely through the tape and the carrier, to provide a plurality of integrated circuit packages.

In still another aspect of the present invention, there is provided a strip including a plurality of integrated circuit packages. The strip includes a plurality of semiconductor dice, a plurality of sets of contact pads, each set of contact pads circumscribing a respective one of the semiconductor dice. A plurality of wire bonds connect the semiconductor dice to contact pads of respective ones of the sets of contact pads. A molding material encapsulates the wire bonds and covers the semiconductor dice and sets of contact pads. A substrate extends around a margin of the molding material, the substrate having an aperture therein in which surfaces of the contact pads and the molding material are exposed. A carrier is backed by a tape, the substrate being mounted in a void in the carrier, to the tape. A plurality of saw grooves singulate the integrated circuit packages. The saw grooves extend through the molding material and the substrate, ending at the tape such that the saw grooves extend at most only partly through the tape.

In one aspect of the present invention, the integrated circuit package does not include a die attach pad. Advantageously, this results in a low package profile. In other advantages, extremely small package assembly is possible, and corner areas of the package are available for additional input/output (I/O).

In another aspect of the present invention, fiducial markings are created on the top surface of the substrate and these fiducial markings are visible through the use of a transparent mask. The substrate is mounted to a tape that backs a carrier, in a void in the carrier. Saw grooves singulate the integrated circuit packages. The saw grooves extend through the molding material and the substrate, ending at the tape such that the saw grooves extend at most only partly through the tape. Thus, the saw grooves extend from the top side of the packages of the strip, rather than the bottom side as in the prior art. The transparent mask permits visibility of the fiducial marks on the top side for sawing. Advantageously, the packages can be saw singulated while retaining the package on the tape, since the saw grooves do not extend through the tape. In another aspect, the tape is an ultraviolet (UV) light tape that is treated with UV light after mounting the substrate to the tape. Exposed portions of the tape become much less sticky after UV light treatment.

BRIEF DESCRIPTION OF THE DRAWINGS

The invention will be better understood with reference to the drawings and to the following description, in which:

FIG. 3 shows an additional processing step for manufacturing a leadless plastic chip carrier according to another embodiment of the present invention.

DETAILED DESCRIPTION OF THE PREFERRED EMBODIMENTS

Figure 1A:
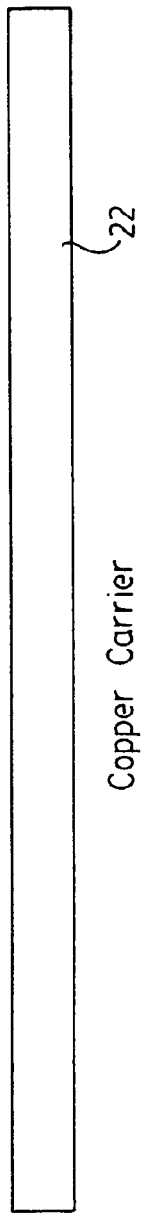
FIGS. 1A to 1O show processing steps for manufacturing a leadless plastic chip carrier according to an embodiment of the present invention.

Reference is now made to the figures to describe a process for fabricating an integrated circuit package according to one embodiment of the present invention. The integrated circuit package is indicated generally by the numeral 20. Metal is plated up on a substrate 22 to provide a plurality of contacts pads 24 and a plurality of fiducial markings 26 on a periphery of the contact pads 24. A transparent mask 28 is selectively deposited on the substrate 22, over the fiducial markings 26. A semiconductor die 30 is mounted on the substrate 22 such that the contact pads 24 circumscribe the semiconductor die 30 and the semiconductor die 30 is wire bonded to ones of the contact pads 24. The wire bonds 32 are encapsulated and the semiconductor die 30 and contact pads 24 are covered in a molding material 34. The substrate 22 is selectively etched to thereby etch away the substrate 22 underneath the contact pads 24 and the semiconductor die 30. The integrated circuit package 20 is singulated from other integrated circuit packages 20 by sawing using the fiducial markings 26.

The process for fabricating the integrated circuit package 20 will now be described with particular reference to FIGS. 1A to 1O. For ease of illustration, much of the following description refers particularly to a single integrated circuit package. It will be understood however, that the integrated circuit package 20 is gang fabricated and then singulated. Gang fabrication of integrated circuit packages is depicted in FIGS. 2A to 2O.

Figure 2A:
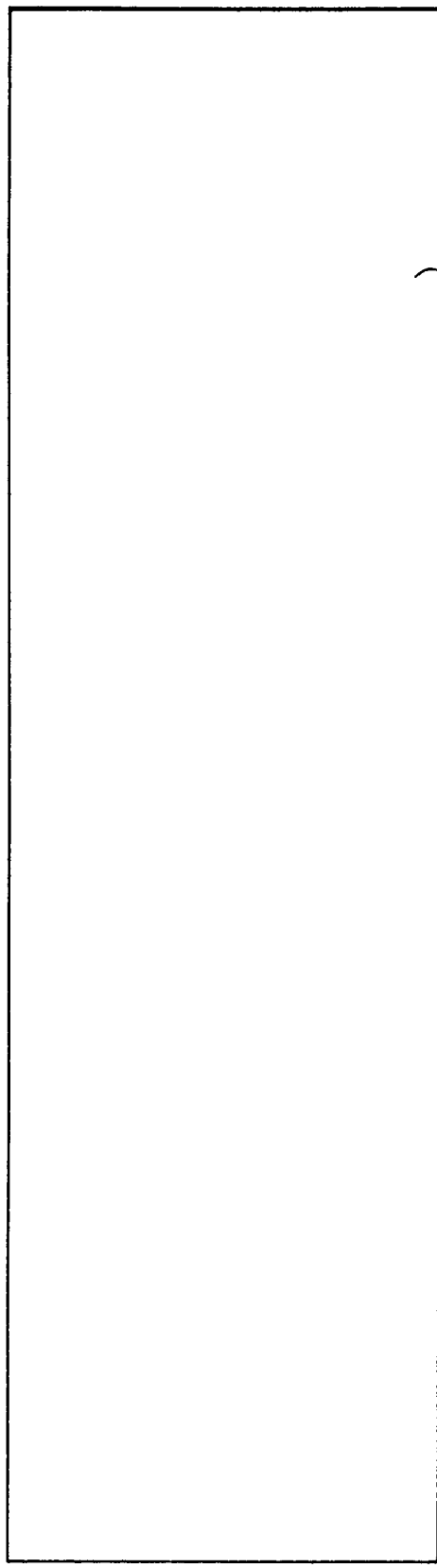
FIGS. 2A to 2O show corresponding views of the processing steps of FIGS. 1A to 1O.

FIG. 1A shows a sectional side view of a copper (Cu) panel substrate which forms the raw material for a carrier for the integrated circuit package 20. FIG. 2A shows a top view of the copper panel substrate of FIG. 1A. The copper panel substrate, referred to above as the substrate 22, is a copper foil that is used to carry several integrated circuit packages 20. In FIG. 1A, only a portion of the substrate 22 is shown, that portion being a portion on which a single integrated circuit package 20 is fabricated. The remainder of the substrate 22, including portions on which other integrated circuit packages are fabricated, is indicated by stippled lines.

Figure 1B:
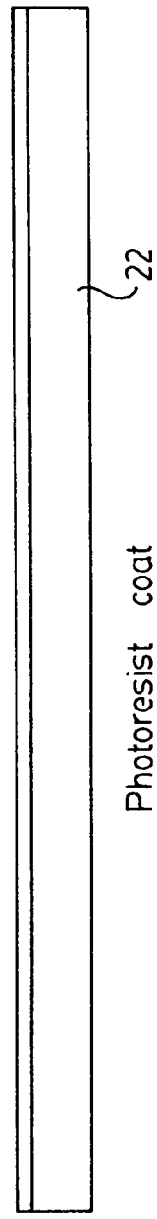
Figure 1C:
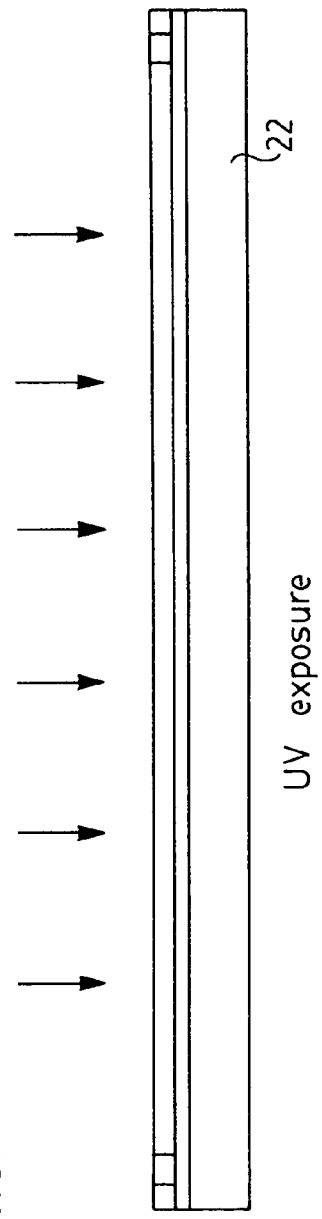
Figure 1D:
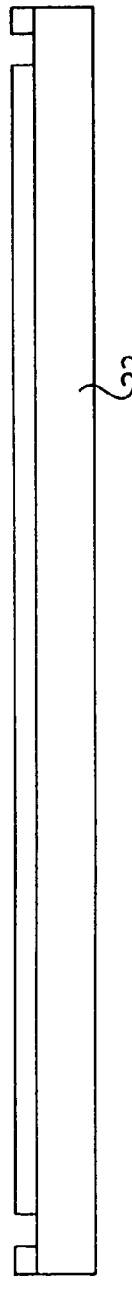
Figure 2B:
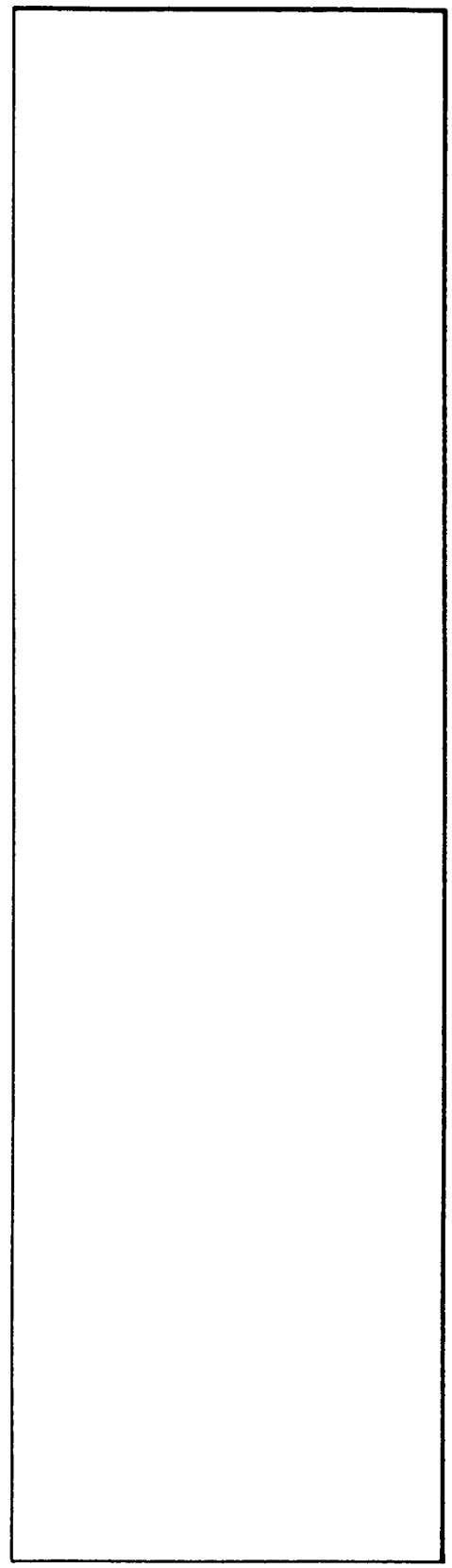
Figure 2C:
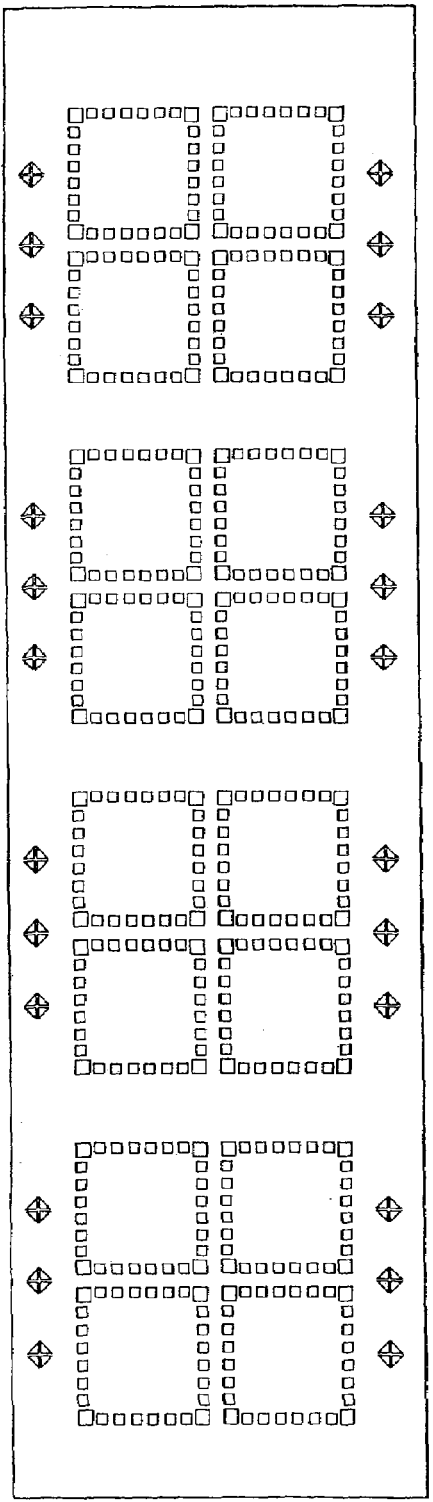
Figure 2D:
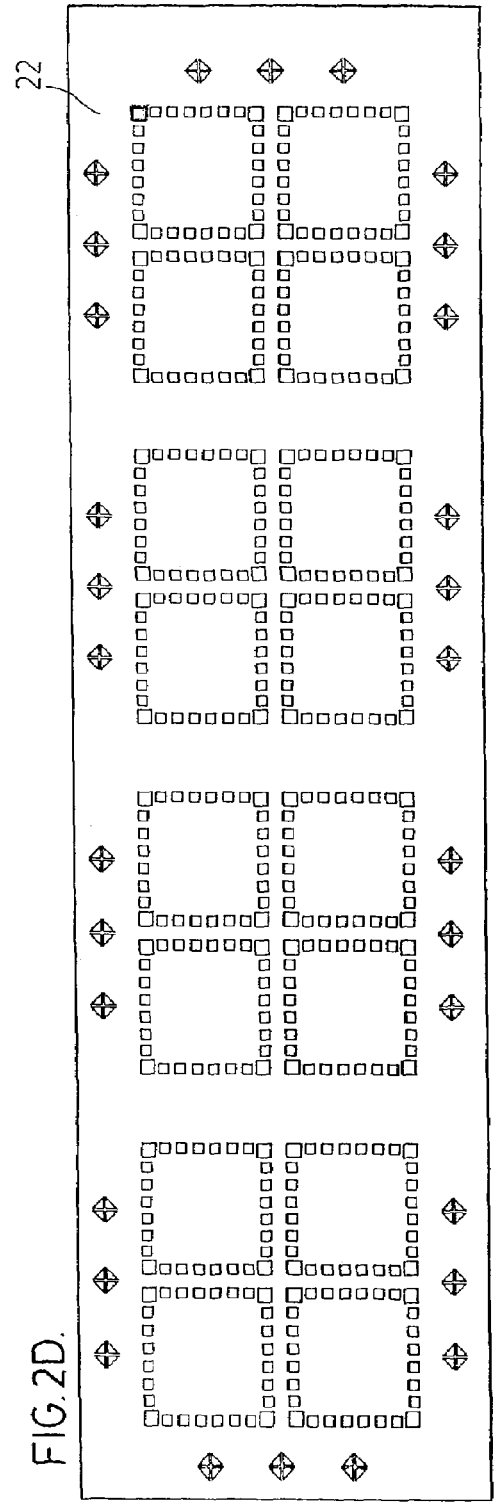

Referring to FIGS. 1B and 2B, the copper panel substrate 22 is coated with a layer of a photo-imageable solder mask such as a photo-imageable epoxy using known coating techniques. The photo-imageable solder mask is imaged by exposure of the mask to ultraviolet (UV) light masked by a photo-tool (FIGS. 1C and 2C). For the purpose of clarity, FIGS. 2C to 2O are not drawn to scale. It will be appreciated that FIGS. 2C to 2O show much fewer units than are fabricated on a single copper panel substrate 22 as only 16 such units are shown for clarity. After exposure using the photo-tool, the photo-imageable solder mask is developed to pattern the solder mask on the copper panel substrate 22, as shown in FIGS. 1D and 2D. A desired metallization pattern is thereby defined by the resulting pits in the photo-imageable solder mask in which the top surface of the copper panel substrate 22 is exposed.

Figure 1E:
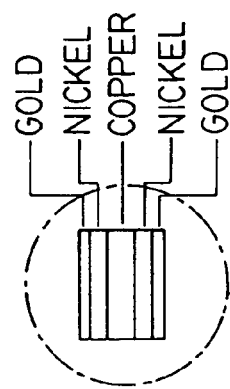
Figure 1E:
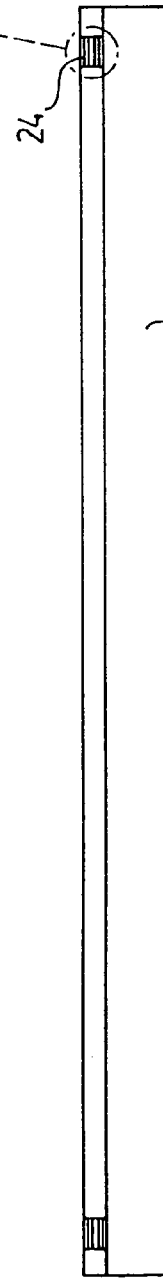
Figure 2E:
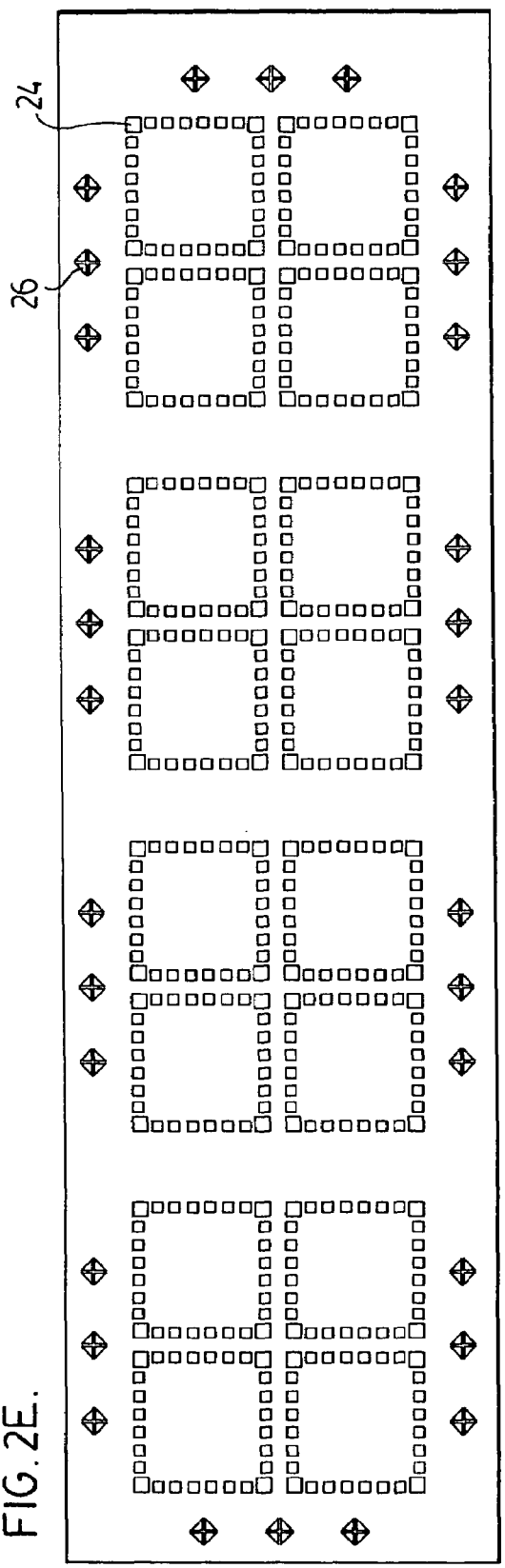

Referring to FIGS. 1E and 2E, layers of metal are deposited by electroplating metal in the pits in the solder mask. The contact pads 24 and fiducial markings 26 are thereby selectively plated. The fiducial markings 26 are not shown in FIG. 1E as this Figure shows only the portion of the substrate on which the single integrated circuit package 20 is fabricated. As shown in FIG. 2E, the fiducial markings 26 are located peripheral to the contact pads 24.

Different plating options are possible. In one particular option, a layer of Au (gold) (for example, between 5 and 10 microinches) is deposited on the copper panel substrate 22, followed by layers of Ni (nickel) (for example, between 20 and 40 microinches), and Cu (40 microns). Final layers of Ni (for example, between 20 and 40 microinches) and Au (for example, between 5 and 10 microinches) are then deposited.

Other plating options are also available, with a metal layer or metal layers sandwiched between a first layer of etch resistant metal such as Au or Pd and a top layer of metal suitable for wire bonding to, such as Au or Pd.

Figure 1F:
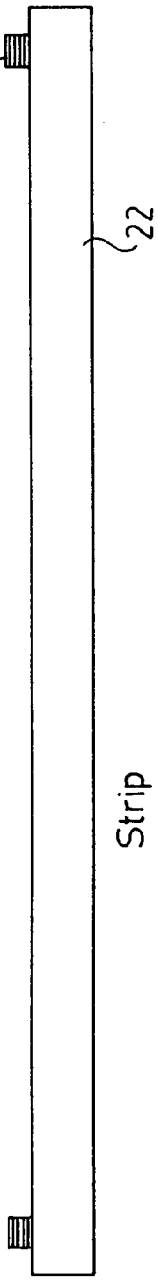
Figure 2F:
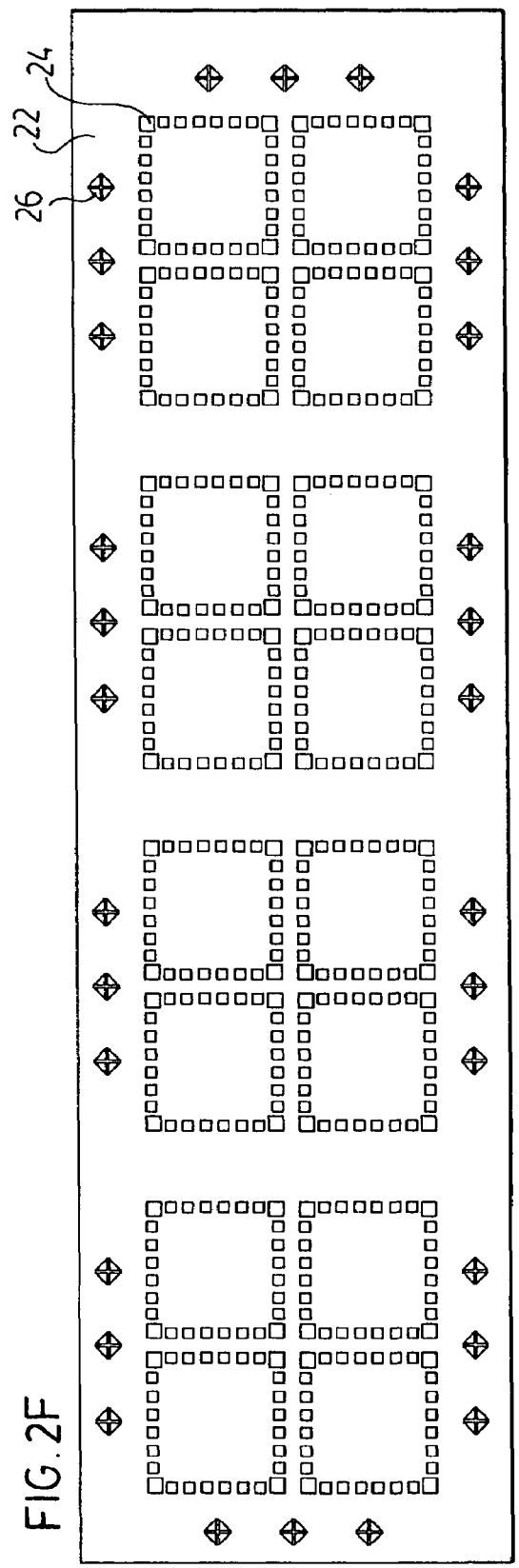

Referring now to FIGS. 1F and 2F, the remainder of the photo-imageable solder mask is stripped away using conventional means. Thus, the plated up contact pads 24 and fiducial markings 26 are left on the copper panel substrate 22. As shown in FIG. 2F, the contact pads 24 are plated up in sets of contact pads 24 that form a square shaped border.

Next, the transparent mask 28 in the form of a transparent solder mask is selectively deposited on both sides of the copper panel substrate 22. The transparent mask 28 is applied over an area of the copper panel substrate 22 and the fiducial markings 26. The transparent mask 28 is shown generally in light grey in FIG. 2G As shown, the areas of the copper panel substrate 22 on which the integrated circuit packages 20 are fabricated, are not covered with the transparent mask 28. Thus, the transparent mask 28 is applied only to the area of the copper panel substrate 22 (and fiducial markings 26) that does not form part of the integrated circuit packages 20. Since FIG. 1G shows only the portion of the copper panel substrate 22 on which one integrated circuit package 20 is fabricated, FIG. 1G does not show any transparent mask 28.

Referring now to FIGS. 1H and 2H, singulated semiconductor dice 30 are then mounted on the copper panel substrate 22 via a black thermally conductive and electrically insulative epoxy and the epoxy is cured. Each singulated semiconductor die 30 is mounted in a respective set of contact pads 24 such that each semiconductor die 30 is circumscribed by a respective set of contact pads 24.

Figure 1J:
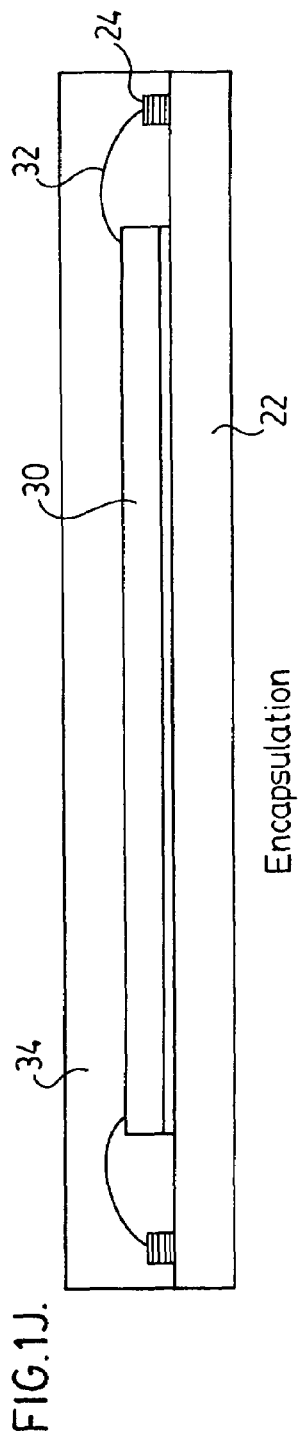
Figure 2I:
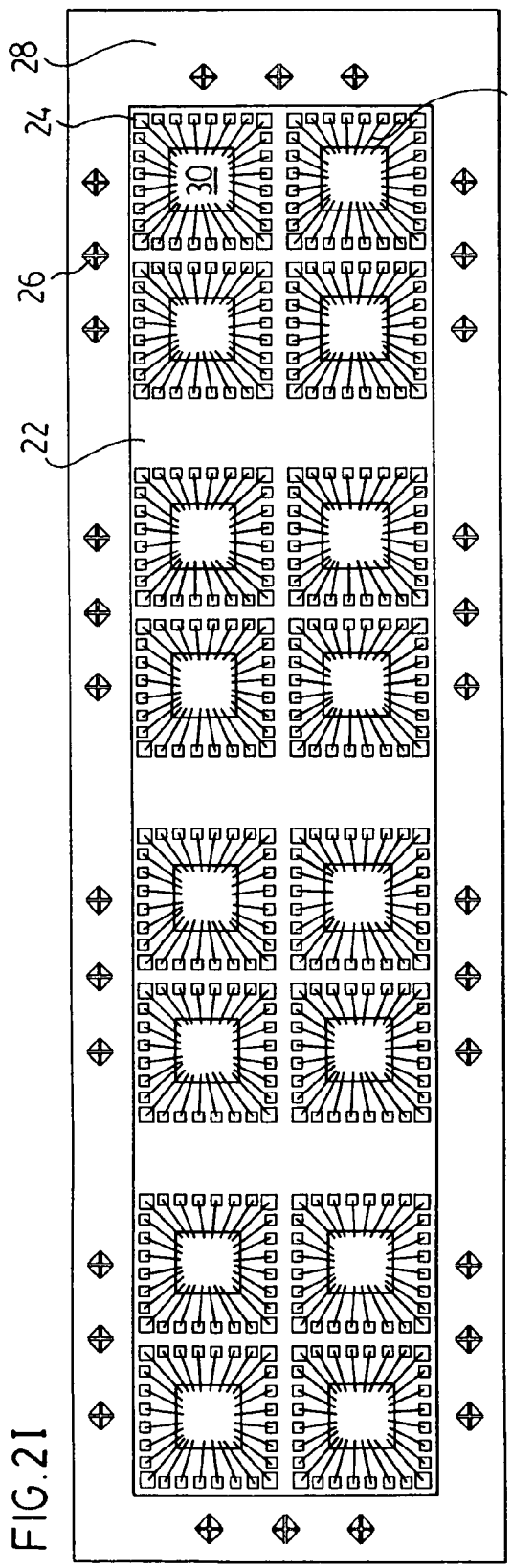
Figure 2J:
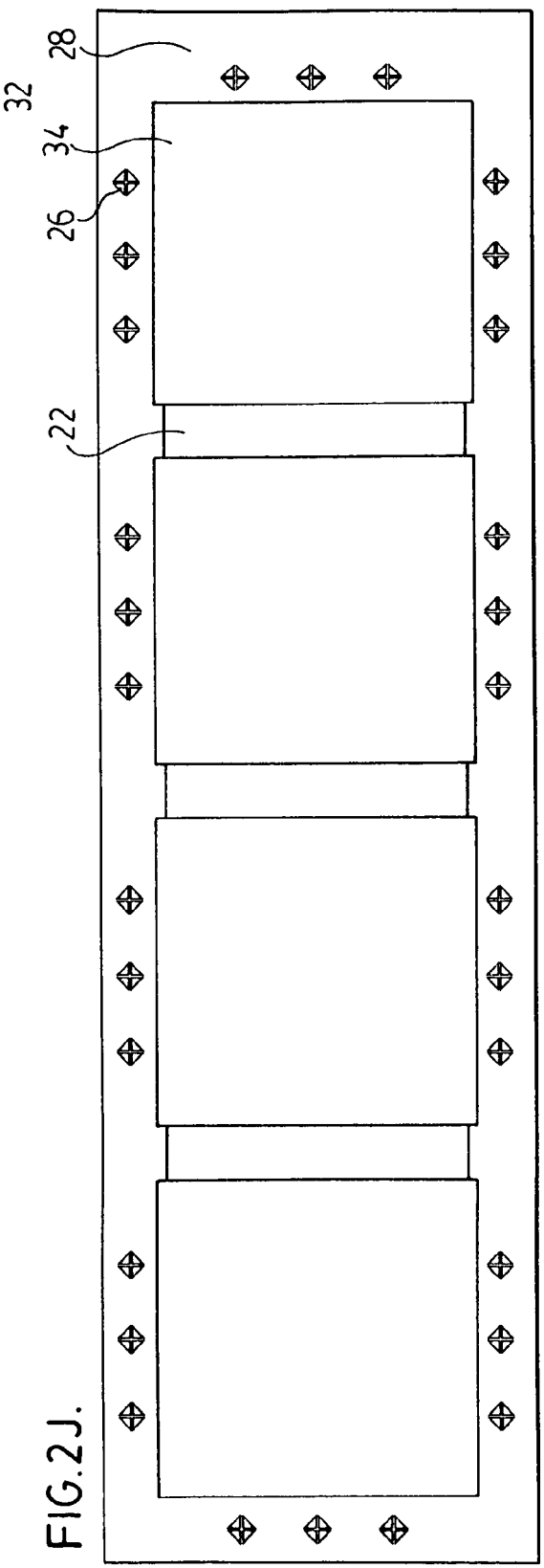

Gold wire bonds 32 are then bonded between each semiconductor die 30 and ones of the respective set of contact pads 24 (FIGS. 1I and 2I). Thus, bond pads of the semiconductor dice 30 are connected to respective contact pads 24. The copper panel substrate 22 is then placed in a suitable mold for molding using a suitable molding material 34 such as a thermosetting epoxy. The wire bonds 32 are encapsulated and the semiconductor dice 30 and contact pads 24 are covered by the molding material 34 (FIGS. 1J and 2J). The molding material 34 is molded in pockets as shown in FIG. 2I. Each pocket includes several semiconductor dice 30 and respective sets of contact pads 24 and overlaps an edge portion of the transparent mask 28 that covers the copper panel substrate 22.

Figure 1K:
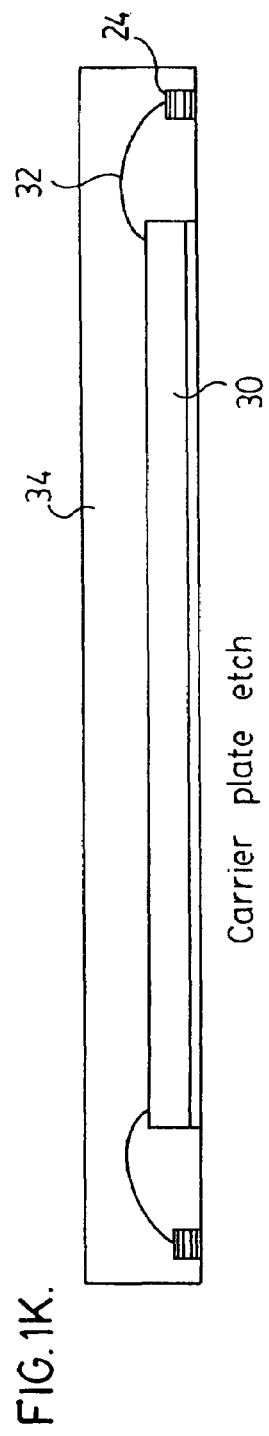

Next, the copper panel substrate 22 is subjected to an alkaline etch via full immersion etching to remove exposed portions thereof (FIGS. 1K and 2K). The area of the copper panel substrate 22 that is covered by the transparent mask is protected from etching. Thus, the copper panel substrate 22 is selectively etched to etch away the portions of the copper panel substrate 22 on which the integrated circuit packages 20 are fabricated. Because the molding material 34 overlaps an edge portion of the transparent mask 28, the molding material 34 remains attached to the edge portion of the transparent mask 28 and the remainder of the copper panel substrate 22 after etching. The contact pads 24 and the black epoxy are thereby exposed. It will be appreciated that because FIG. 1K shows only the portion of the cross-section that includes the integrated circuit package 20 and because the copper panel substrate 22 has been etched away from this portion, no copper panel substrate is shown in FIG. 1K.

Figure 1L:
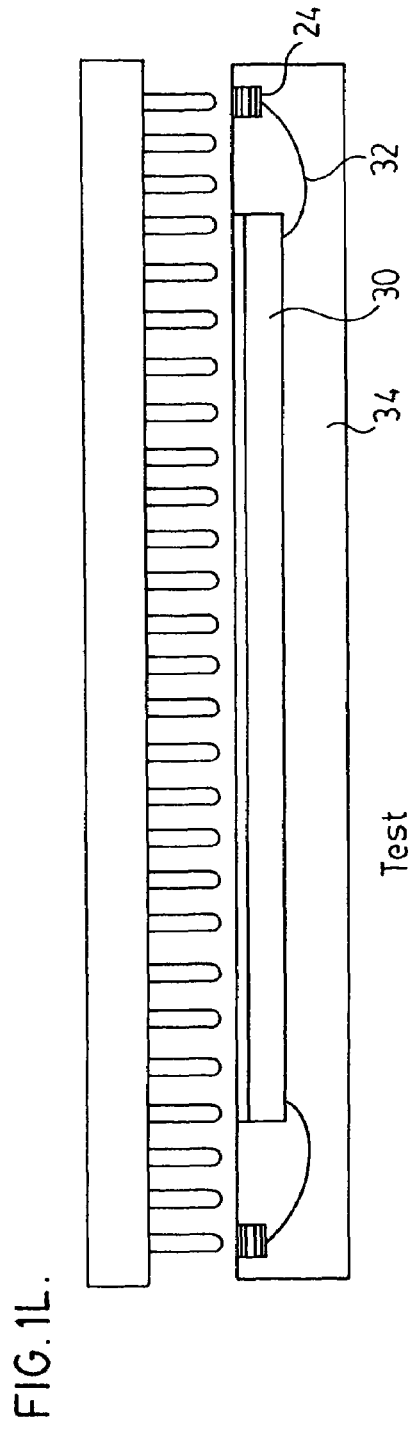

After etching away the exposed portions of the copper panel substrate 22, testing is carried out to ensure quality of the integrated circuit packages 20 while still attached to the copper panel substrate 22. The copper panel substrate 22 is positioned such that the exposed sides of the contact pads face upwardly for testing (FIGS. 1L and 2L).

Figure 1M:
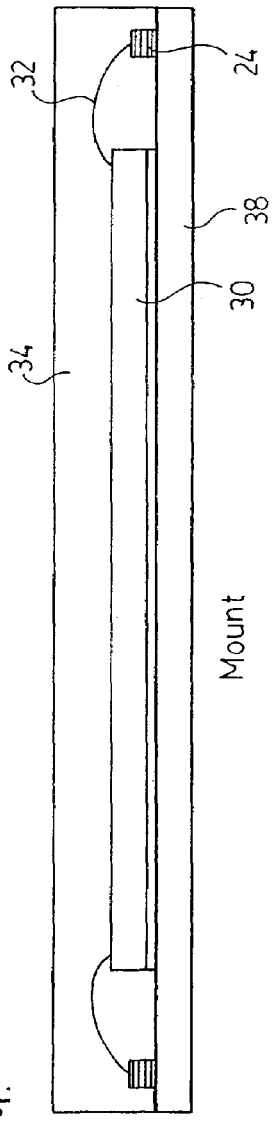
Figure 2M:
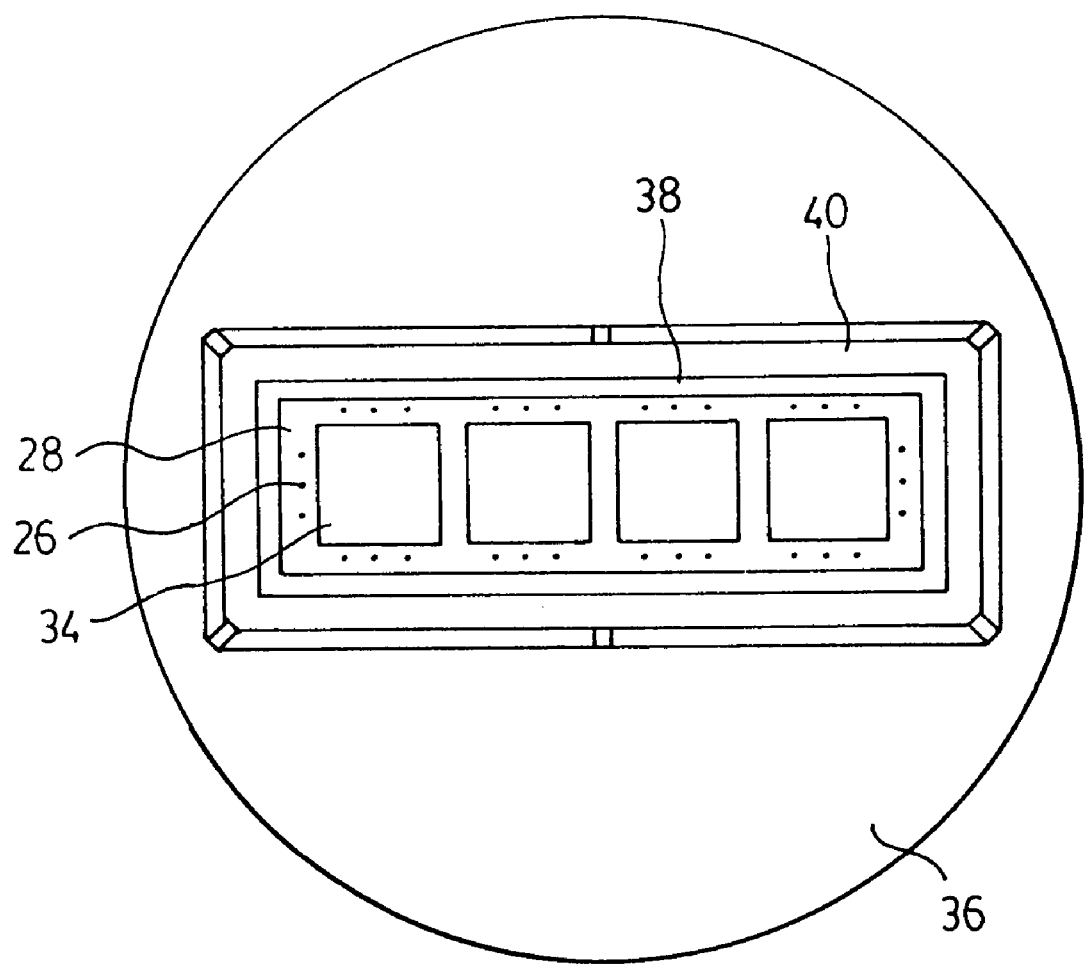

Next, the copper panel substrate 22 is mounted to a plastic carrier ring 36 (FIGS. 1M and 2M). A portion of the plastic carrier ring 36 is backed with a UV curable adhesive tape 38. The plastic carrier ring 36 includes a rectangular void in the center in which the UV curable adhesive tape 38 is exposed with the adhesive side facing upwardly in FIGS. 1M and 2M. The copper panel substrate 22 is mounted to the UV curable adhesive tape 38 with the exposed contact pads 24 facing the tape 38.

As shown, the carrier ring 36 includes punch-out tabs that keep an interior carrier strip 40 of the plastic carrier ring 36 including the rectangular void, the tape 38 and the copper panel substrate 22 including the integrated circuit packages 20 that are joined together, attached to an exterior portion of the carrier ring 36.

Figure 1N:
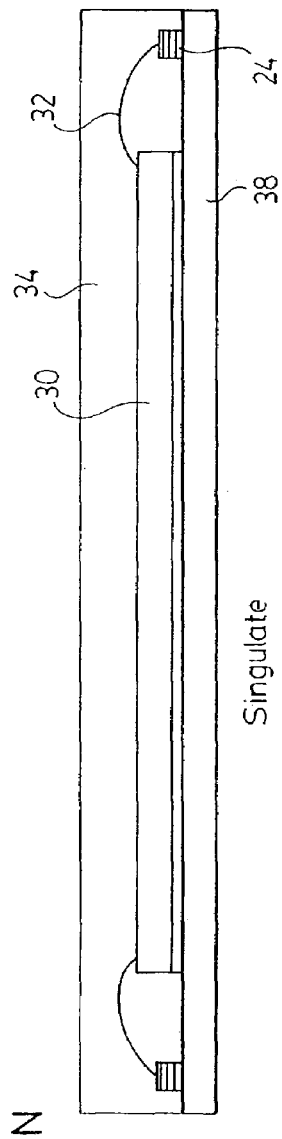
Figure 2N:
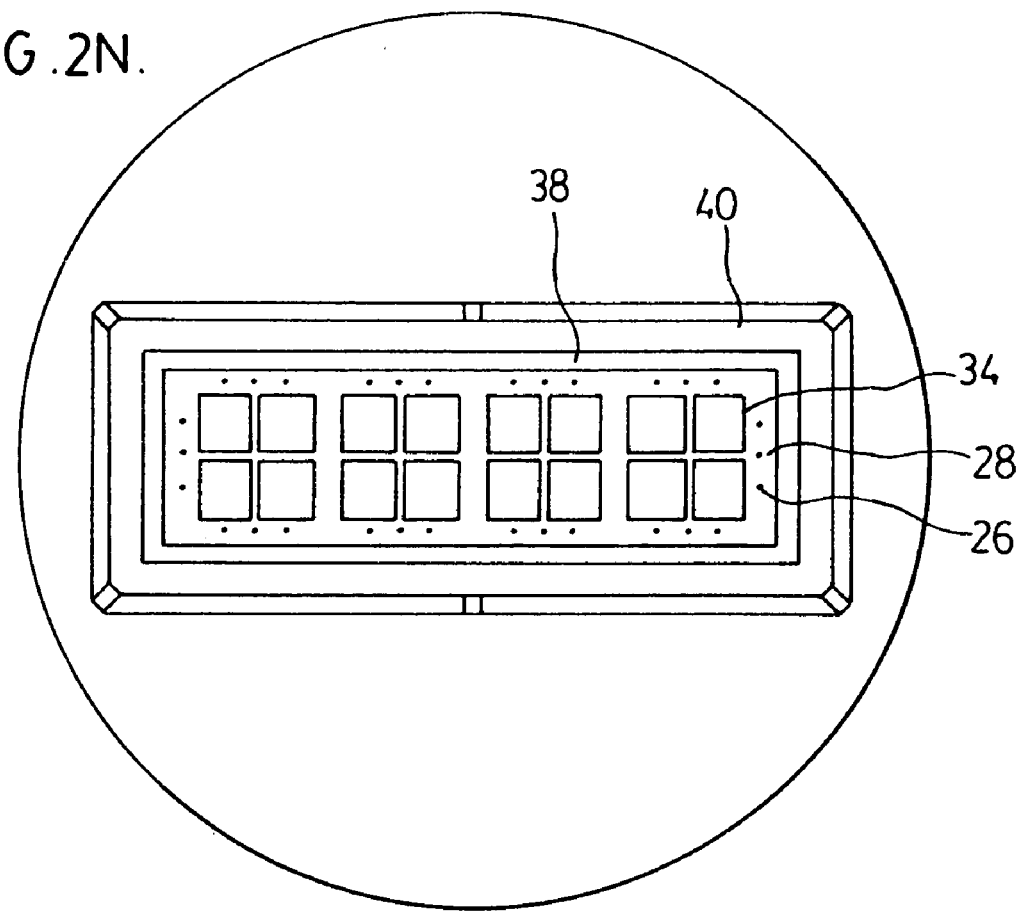
Figure 2O:
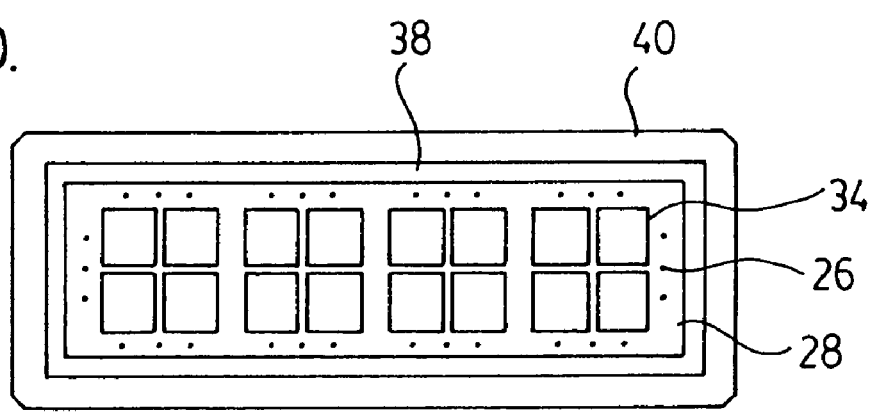

Next the individual integrated circuit packages 20 that are joined together by the molding material 34 and the copper panel substrate 22 are saw singulated from the top side of the packages 20, using the fiducial markings 26 (FIGS. 1N and 2N). The fiducial markings 26 on the copper panel substrate 22 are still visible through the transparent mask 28 permitting saw singulation from the top side using the fiducial markings 26 as references for sawing. It will be understood that the plastic carrier ring 36 is compatible with a wafer saw device that is used for singulation of the individual integrated circuit packages 20. Thus, rather than using a reusable saw ring, as in conventional methods, a plastic carrier ring 36 is used.

During saw singulating, a high speed rotary saw is used to cut through the molding material 34 and through the copper panel substrate 22 but not completely through the UV curable adhesive tape 38. Thus, the tape 38 keeps the packages together in the saw ring after saw singulation. After sawing, the UV curable adhesive tape 38 is UV light treated to reduce the adhesiveness of the tape 38. It will be appreciated that the UV tape 38 is sufficiently adhered to the packages 20 during sawing and the adhesiveness of the tape is reduced after UV light treatment to allow surface mount technology equipment to pick the individual packages 20 from the adhesive tape 38 for placing on a motherboard.

Figure 1O:
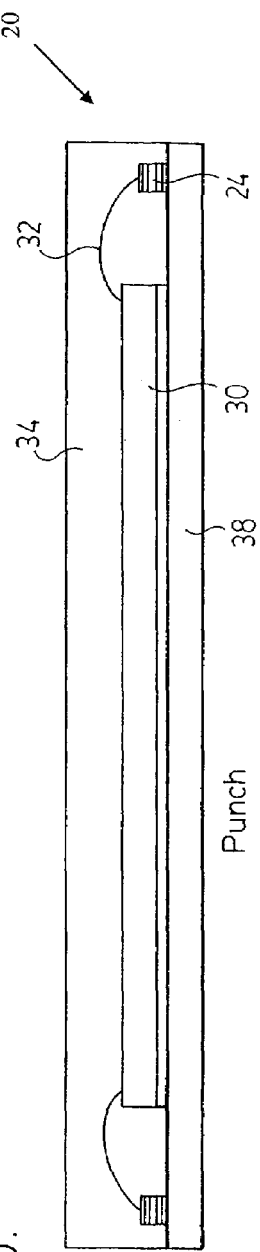

The interior carrier strip 40 is then punched out of the carrier ring 36 by breaking the punch out tabs using, for example, punch and die tooling (FIGS. 1O and 2O). Thus, the singulated integrated circuit packages 20 are retained in the interior carrier strip 40 for shipping to the customer. As indicated above, the packages 20 are removable from the adhesive tape 38 in the interior carrier strip 40.

A specific embodiment of the present invention has been shown and described herein. Modifications and variations to this embodiment are possible. For example, the process can include the additional step of marking the molding material using a known laser etching technique, after selectively etching the copper panel substrate 22. Also, testing after etching is not necessary. Testing and the method of testing is dependent on the density of packages and the tester capability. It is not necessary that all of the packages 20 be tested all at once. Although the Figures referred to and described above show only one row of contact pads circumscribing the semiconductor die for each package, more than one row of contact pads can be plated up. It will be understood that two rows of contact pads circumscribing the die attach pad are possible. Also, the contact pads are not limited to square shaped contact pads as shown. Circular contact pads can also be plated up. Other metal plating options are also possible. One particular variation is shown in FIG. 3, in which solder bumps 42 are deposited on the contact pads 24 after etching (shown in FIGS. 1K and 2K) and prior to testing (shown in FIGS. 1L and 2L). The solder bumps 42 are deposited using known pick and place techniques. Alternatively, the solder balls 42 are deposited by screen printing and solder reflow techniques.

Still other modifications and variations may occur to those skilled in the art. All such modifications and variations are believed to be within the sphere and scope of the present invention.

What is claimed is:
1. A process for fabricating an integrated circuit package, comprising:
selectively plating up metal on a substrate to provide a plurality of contacts pads and a plurality of fiducial markings on a periphery of said contact pads;

selectively depositing a transparent mask on said substrate, over said fiducial markings;

mounting a semiconductor die on said substrate such that said contact pads circumscribe said semiconductor die;

wire bonding said semiconductor die to ones of the contact pads;

encapsulating the wire bonds and covering the semiconductor die and contact pads in a molding material;

thereby etching away the substrate underneath said contact pads and said semiconductor die;

singulating said integrated circuit package from other integrated circuit packages by sawing using said fiducial markings.

2. The process according to claim 1 wherein said mounting comprises mounting said semiconductor die using a black epoxy, said black epoxy being exposed after said selective etching said substrate.

3. The process according to claim 1, wherein said selectively plating comprises selectively plating a plurality of layers of metal on said substrate.

4. The process according to claim 1, wherein said selectively plating comprises:

depositing a plating mask on a first surface of said substrate;

patterning said plating mask to expose selected portions of the first surface of the substrate;

electroplating successive layers of metal on said selected portions of the first surface of the substrate; and stripping a remainder of said plating mask.

5. The process according to claim 1, further comprising depositing solder bumps on said contact pads after selectively etching said substrate.

6. The process according to claim 1, further comprising mounting said substrate to a carrier prior to singulating, wherein said singulating comprises sawing through said molding material and said substrate without sawing entirely through said carrier.

7. The process according to claim 6, wherein said carrier comprises a tape having an adhesive side to which said substrate is mounted.

8. The process according to claim 6, wherein said carrier comprises a carrier ring backed with an adhesive tape, said carrier ring having a void in which said adhesive tape is exposed such that said mounting said substrate comprises mounting said substrate to said adhesive tape in said void.

9. The process according to claim 8, further comprising punching out a portion of said carrier ring including said substrate, after singulating to provide a singulated integrated circuit package along with said other integrated circuit packages.

10. A process for fabricating a plurality of integrated circuit packages comprising:

selectively plating up metal on a substrate to provide a plurality of sets of contacts pds;

mounting a plurality of semiconductor dice on said substrate, each one of said semiconductor dice being circumscribed by a respective one of said sets of contact pads;

wire bonding said semiconductor dice to contact pads of respective ones of said sets of contact pads;

encapsulating said wire bonds and covering the semiconductor dice and sets of contact pads in a molding material;

selectively etching said substrate thereby etching away the substrate underneath said contact pads and said semiconductor dice;

mounting said substrate to a tape in a void in a carrier frame;

singulating said integrated circuit packages by sawing through said molding material and said substrate without sawing entirely through said tape and said carrier to provide a plurality of integrated circuit packages.

11. The process according to claim 10, further comprising punching out a portion of said carrier frame including said adhesive to provide a strip including said integrated circuit packages.

12. The process according to claim 10, wherein said mounting said plurality of said semiconductor dice comprises mounting said plurality of said semiconductor dice using a black epoxy, said black epoxy being exposed after said selective etching of said substrate.

13. The process according to claim 10, further comprising strip testing of said integrated circuit packages prior to mounting said substrate to said tape.

14. The process according to claim 10, further comprising laser marking of upper surfaces of said packages after encapsulating.

15. The process according to claim 10, further comprising depositing solder bumps on said contact pads after selectively etching.

16. The process according to claim 10, wherein said selectively plating up metal includes plating up metal on said substrate to provide a plurality of fiducial markings on a periphery of said sets of contacts.

17. The process according to claim 16, further comprising selectively depositing a transparent mask on said substrate, over said fiducial markings and wherein said singulating is carried out by sawing using said fiducial markings.

18. A strip including a plurality of integrated circuit packages, the strip comprising:

a plurality of semiconductor dice;

a plurality of sets of contact pads, each set of contact pads circumscribing a respective one of said semiconductor dice;

a plurality of wire bonds connecting said semiconductor dice to contact pads of respective ones of said sets of contact pads;

a molding material encapsulating said wire bonds and covering the semiconductor dice and sets of contact pads;

a substrate extending around a margin of said molding material, the substrate having an aperture therein in which a surfaces of said contact pads and said molding material are exposed;

a plurality of fiducial markings on said substrate;

a carrier backed by a tape, said substrate being mounted in a void in said carrier, to said tape; and a plurality of saw grooves singulating said integrated circuit packages, wherein said saw grooves extend through said molding material and said substrate, ending at said tape such that said saw grooves extend at most only partly through said tape.

19. The strip according to claim 18, further comprising a black epoxy on an underside of said semiconductor dice such that said black epoxy is exposed in said aperture in said substrate.

20. The strip according to claim 18, wherein said tape is an ultraviolet curable adhesive tape.

21. The strip according to claim 18, further comprising a plurality of solder bumps on said contact pads.

22. The strip according to claim 18, wherein said substrate includes a transparent mask thereon.

23. The strip according to claim 22, wherein said fiducial markings are visible through said transparent mask.

24. The strip according to claim 22, wherein said transparent mask is a transparent solder mask.

* * * * *